US012207412B2

United States Patent
Nozawa et al.

(10) Patent No.: US 12,207,412 B2
(45) Date of Patent: Jan. 21, 2025

(54) ARTICLE TRANSPORT SYSTEM (71) Applicant: FUJI CORPORATION, Chiryu (JP)

(72) Inventors: Mizuho Nozawa, Kota-cho (JP); Shinichi Fujii, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 393 days.

(21) Appl. No.: 17/758,611

(22) PCT Filed: Jan. 14, 2020

(86) PCT No.: PCT/JP2020/000933
§ 371 (c)(1),
(2) Date: Jul. 11, 2022

(87) PCT Pub. No.: WO2021/144866
PCT Pub. Date: Jul. 22, 2021

(65) Prior Publication Data
US 2023/0051556 A1 Feb. 16, 2023

(51) Int. Cl.
H05K 13/02 (2006.01)
H05K 13/08 (2006.01)

(52) U.S. Cl.
CPC ......... H05K 13/021 (2013.01); H05K 13/086 (2018.08)

(58) Field of Classification Search
CPC ..................... H05K 13/021; H05K 13/086
USPC ...................................................... 340/679
See application file for complete search history.

(56) References Cited

U.S. PATENT DOCUMENTS

| 5,434,490 | A  | * | 7/1995  | Ishida ................. B61L 23/005 |
|           |    |   |         | 318/16                              |
| 9,670,004 | B1 | * | 6/2017  | Horii ................. G05B 19/4189 |
| 9,758,308 | B1 | * | 9/2017  | Nishikawa ........ H01L 21/67715    |
| 2008/0066207 | A1 | * | 3/2008 | Beniyama .............. B25J 9/0003 |
|           |    |   |         | 901/1                               |
| 2017/0229333 | A1 | * | 8/2017 | Kinugawa ......... H01L 21/67724   |
| 2017/0347507 | A1 | * | 11/2017 | Takeda ................. G05B 19/418 |
| 2018/0122671 | A1 | * | 5/2018 | Niiyama ............... B65G 43/10  |
| 2018/0327009 | A1 | * | 11/2018 | Takagawa ............ B61L 25/025  |

(Continued)

FOREIGN PATENT DOCUMENTS

JP   8-234839 A   9/1996
JP   2009-12948   1/2009
(Continued)

OTHER PUBLICATIONS

International Search Report Issued Mar. 17, 2020, in PCT/JP2020/000933, filed on Jan. 14, 2020, 2 pages.

*Primary Examiner* — Kerri L McNally
(74) *Attorney, Agent, or Firm* — Oblon, McClelland, Maier & Neustadt, L.L.P.

(57) ABSTRACT

An article transport system includes a station group, a first communication device, and a determination section. In the station group, multiple stations capable of sending out and receiving an article, which is used in a board work machine performing a predetermined board work on a board, are arranged side by side. The first communication device includes a first communication section, which is provided in a transport vehicle capable of sending out and receiving the article between the transport vehicle and a predetermined station among the multiple stations, and a second communication section, which is provided in each of the multiple stations.

14 Claims, 6 Drawing Sheets

(56) References Cited

U.S. PATENT DOCUMENTS

2019/0281737 A1    9/2019  Hayashi et al.
2020/0017313 A1*   1/2020  Mori .................... B65G 47/642

FOREIGN PATENT DOCUMENTS

| JP | 5963863 B2 | 8/2016 |
| JP | WO 2017/033268 A1 | 3/2017 |
| WO | WO 2014/010083 A1 | 1/2014 |
| WO | WO 2019/229786 A1 | 12/2019 |

* cited by examiner

ARTICLE TRANSPORT SYSTEM

TECHNICAL FIELD

The present specification discloses a technique related to an article transport system.

BACKGROUND ART

A component mounting system described in Patent Literature 1 includes a replenishing device, transport means, a contactless transmission device, and a collation section. The replenishing device is capable of traveling between a component storage and multiple mounting modules, replenishes the multiple mounting modules with component supply elements by supporting the component supply elements, and recovers the component supply elements from the multiple mounting modules. The transport means transports the replenishing device between the component storage and the multiple mounting modules. The contactless transmission device contactless transmits signals between the multiple mounting modules and the replenishing device. The collation section reads and collates IDs of the component supply elements replenishing between the mounting modules and the replenishing device.

A component mounting line described in Patent Literature 2 includes a unit storage provided in the component mounting line, and an AGV that transports a member to the unit storage. Further, in the component mounting line described in Patent Literature 2, the AGV carries the feeder in and out of the feeder storage only to suppress interference between the movement of the AGV and the movement of the exchange robot, thereby attempting to limit a guide installation range.

One of a transport vehicle and a device of a transport system described in Patent Literature 3 includes a transfer mechanism section, communication means, and control means. The transfer mechanism section transfers a baggage by sending the mounted baggage to a partner side, which is the other side of the transport vehicle and the device, or by picking up the baggage from the partner side. The communication means issues a transfer request signal requesting transfer permission to the partner side and acquires a transfer permission signal indicating permission for the request. Before the communication means acquires the transfer permission signal, the control means controls the transfer mechanism section so as to perform a transfer operation within a range in which the transfer mechanism section does not intrude into the partner side.

Further, an automatic guided vehicle described in Patent Literature 3 receives a transfer instruction of a wafer cassette from a transport vehicle controller, stops in front of a processing device station, and initiates the transfer operation of the wafer cassette while performing interlock communication with the processing device via optical communication. In the interlock communication, a transfer partner is specified, the condition of the partner is checked, a reply from the partner is confirmed, and then the transfer operation is performed.

Patent Literature

Patent Literature 1: International Publication No. WO 2014/010083
Patent Literature 2: International Publication No. WO 2017/033268
Patent Literature 3: Japanese Unexamined Patent Publication No. 2009-012948

BRIEF SUMMARY

Technical Problem

However, none of the above references specifically describes determining whether a transport vehicle has arrived at a target station, which is a station where the transport vehicle is to send out or receive an article.

In view of such a circumstance, the present specification discloses an article transport system capable of determining whether a transport vehicle has arrived at a target station, which is a station where the transport vehicle is to send out or receive an article.

Solution to Problem

The present specification discloses an article transport system including a station group, a first communication device, and a determination section. In the station group, multiple stations capable of sending out and receiving an article, which is used in a board work machine performing a predetermined board work on a board, are arranged side by side. The first communication device includes a first communication section, which is provided in a transport vehicle capable of sending out the article to a predetermined station among the multiple stations and receiving the article from the predetermined station among the multiple stations, and a second communication section, which is provided in each of the multiple stations. In the first communication device, when the transport vehicle has arrived at one station among the multiple stations, first wireless communication between the second communication section, which is provided in the one station, and the first communication section is permitted, and the first wireless communication between the second communication section, which is provided in another station, and the first communication section is regulated. The determination section determines whether the transport vehicle has arrived at a target station, which is the station where the transport vehicle is to send out or receive the article, by utilizing the first communication device.

Advantageous Effects

The article transport system described above includes a station group, a first communication device, and a determination section. Accordingly, the article transport system described above can determine whether a transport vehicle has arrived at a target station, which is a station where the transport vehicle is to send out or receive an article, by utilizing the first communication device.

DESCRIPTION OF EMBODIMENTS

1. Embodiment 1-1. Configuration Example of Board Production Line 1

Figure 1:
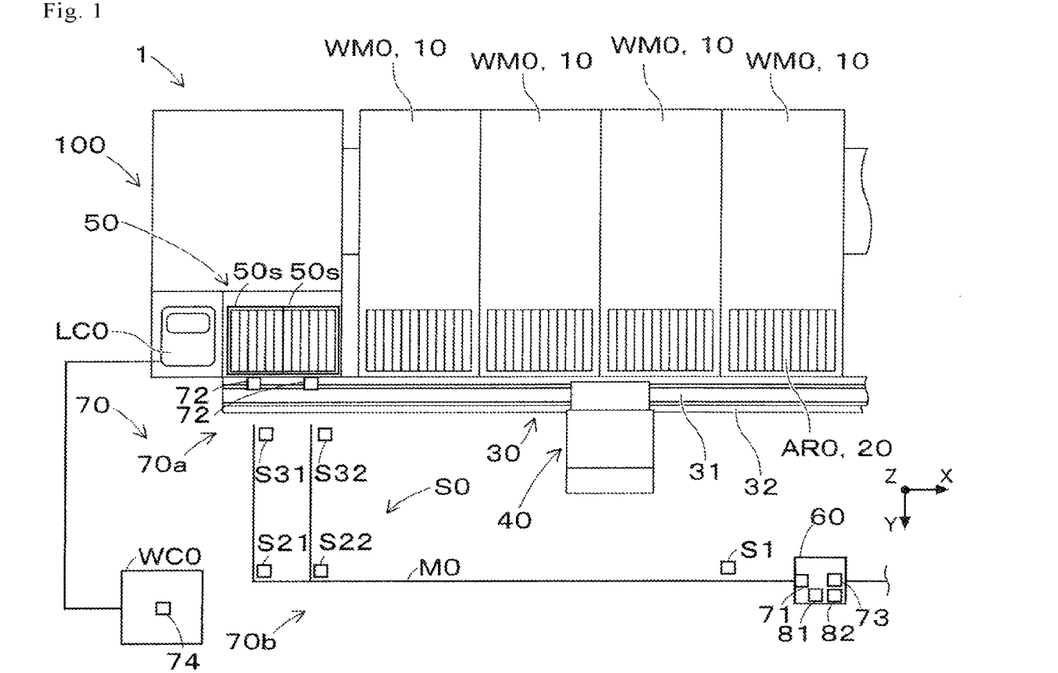
FIG. 1 is a plan view showing a configuration example of a board production line.

As illustrated in FIG. 1, board production line 1 includes at least one component mounter 10 (four in FIG. 1), exchange system 30, article movement device 40, station group 50, transport vehicle 60, communication device 70, line control device LC0, and management device WC0. In the following description, the transporting direction of a board, which is the horizontal width direction of component mounter 10 is defined as the X direction, the horizontal depth direction of component mounter 10 is defined as the Y direction, and the vertical direction perpendicular to the X and Y directions is defined as the Z direction.

Four component mounters 10 are installed along the transporting direction (X direction) of the board. Component mounter 10 is included in board work machine WM0 that performs a predetermined board work on the board. Component mounter 10 carries in the board, positions the board at a predetermined position, makes multiple components to be mounted on the positioned board, and carries out the board on which the components are mounted. That is, the board work by component mounter 10 includes a carry-in operation, a positioning operation, and a carry-out operation of the board. Further, the board work by component mounter 10 includes a component supply operation, a collect operation, and a mounting operation.

For example, component mounter 10 includes a component supply device that supplies a component to be mounted on the board. Multiple feeders 20 are provided in the component supply device in an attachable and detachable manner. Feeder 20 is included in article AR0 used for the component supply operation by component mounter 10. Further, the component supply device includes at least one slot capable of installing multiple feeders 20. The component supply device of the present embodiment includes two slots, a first slot and a second slot.

The first slot operably holds installed feeder 20. The operation of feeder 20 installed in the first slot is controlled in the board work by component mounter 10, and the components are sequentially supplied by a pick-up section provided at a predetermined position of feeder 20. The second slot is disposed below the first slot to stock installed feeder 20. That is, the second slot preliminarily holds feeder 20 used for production or temporarily holds used feeder 20 that is used for production.

An exchange operation of feeder 20 between the first slot and the second slot, and a replenishment operation and a recovery operation of feeder 20 are performed using exchange system 30 and article movement device 40. Specifically, as illustrated in FIG. 1, exchange system 30 includes first rail 31 and second rail 32. First rail 31 and second rail 32 form a traveling path of article movement device 40. First rail 31 and second rail 32 are provided along a disposition direction of four component mounters 10 (the transporting direction (X direction) of the board). First rail 31 and second rail 32 extend over substantially the entire area of the transporting direction (X direction) of the board in board production line 1.

Article movement device 40 is provided so as to be able to travel along the traveling path formed by first rail 31 and second rail 32. Article movement device 40 receives the electric power supplied from a power transmission section by contactless power supply, for example, via a power receiving section provided to face the power transmission section provided in first rail 31. The electric power received by the power receiving section is used for traveling of article movement device 40, a predetermined operation, or the like via a power receiving circuit. It should be noted that article movement device 40 detects, for example, a position (current position) on the traveling path by a position detection device. The position detection device can detect the position (current position) of article movement device 40 on the traveling path, for example, by optical position detection, position detection using electromagnetic induction, or the like.

Further, the "predetermined operation" described above includes an exchange operation for exchanging a device provided in board work machine WM0 in an attachable and detachable manner, such as component mounter 10, with board work machine WM0. In the present embodiment, article movement device 40 uses feeder 20 that supplies the component to be mounted on the board as a device and performs the exchange operation of feeder 20 with component mounter 10, which is board work machine WM0. Further, article movement device 40 can perform the exchange operation of feeder 20 with station group 50.

Specifically, article movement device 40 performs the exchange operation of feeder 20 between the first slot and the second slot of the component supply device of component mounter 10. Further, article movement device 40 transports feeder 20 from station group 50 to the first slot or the second slot of the component supply device and performs the replenishment operation of feeder 20. Further, article movement device 40 transports feeder 20, which is made unnecessary in component mounter 10, from the component supply device to station group 50 and performs the recovery operation of feeder 20.

Figure 2:
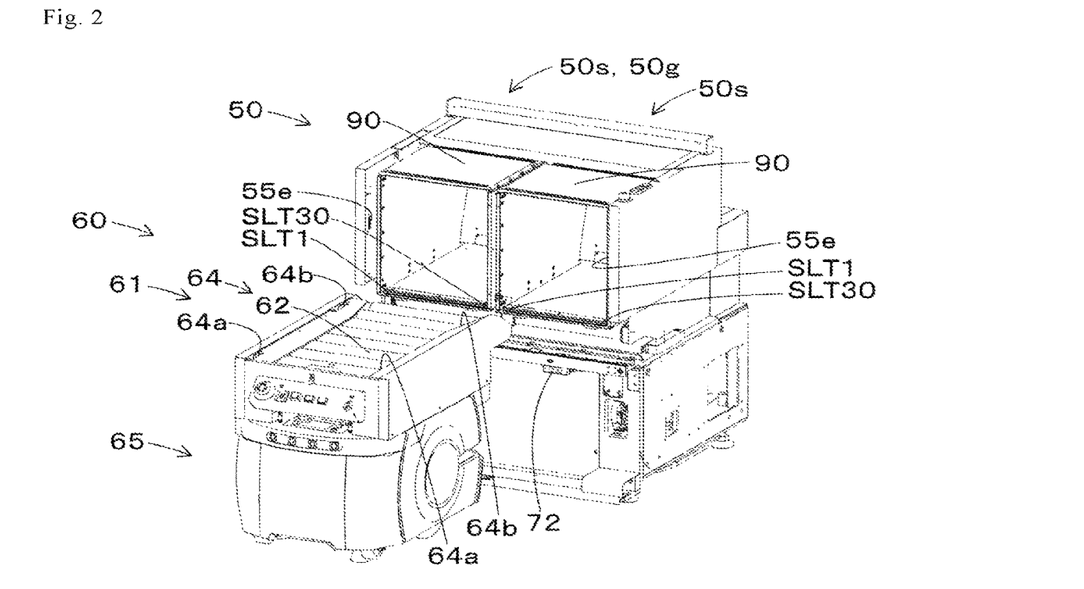
FIG. 2 is an oblique view showing a configuration example of a station group and a transport vehicle.

Station group 50 is provided on a board carry-in side (on the left side in the drawing of FIG. 1) of board production line 1. As illustrated in FIG. 2, station group 50 is provided with multiple stations 50s and 50s (two in FIG. 2) side by side that can send out and receive articles AR0 used in board work machine WM0, such as feeder 20. Each of the multiple (two) stations 50s and 50s may be equipped with accommodation case 90 for accommodating article AR0.

Accommodation case 90 includes, for example, multiple (30 in FIG. 2) slots SLT1 to SLT30, and each slot can be installed with feeder 20. Feeder 20, which is installed in the slot of accommodation case 90, is supplied with electric power from station 50s that is equipped with accommodation case 90, via accommodation case 90 and then becomes in a state capable of communicating with line control device LC0. As a result, the slot of accommodation case 90 and an identification code of feeder 20, which is installed in the slot, are associated with each other and recorded in line control device LC0.

Transport vehicle 60 can send out and receive article AR0 such as feeder 20 between transport vehicle 60 and predetermined station 50s among multiple (two) stations 50s and 50s. Further, transport vehicle 60 can also send out and receive accommodation case 90 accommodating article AR0 between transport vehicle 60 and predetermined station 50s among multiple (two) stations 50s and 50s. Transport vehicle 60 may be a manned transport vehicle to be pulled by an operator or may be an automatic guided vehicle (AGV) that is capable of being self-traveled and does not require pulling by the operator. Transport vehicle 60 of the present embodiment is an automatic guided vehicle.

Line control device LC0 is configured to be capable of inputting and outputting to and from each device constituting board production line 1 and various data via a network. Line control device LC0 monitors an operation status of board production line 1 and integrally controls board work machine WM0 such as component mounter 10, exchange system 30, article movement device 40, and station group 50. Line control device LC0 stores various data for controlling board work machine WM0, exchange system 30, article movement device 40, and station group 50.

Management device WC0 is provided so as to be capable of communicating with line control device LC0 of each of multiple board production lines 1 and can manage the production of board products by using multiple board production lines 1. Further, management device WC0 is provided so as to be capable of communicating with transport vehicle 60 and can also manage transport vehicle 60.

Communication device 70 includes first communication device 70a. Communication device 70 may also include second communication device 70b. Communication device 70 of the present embodiment includes first communication device 70a and second communication device 70b. First communication device 70a performs first wireless communication between one station 50s among multiple (two) stations 50s and 50s, and transport vehicle 60. Second communication device 70b performs second wireless communication between management device WC0 and transport vehicle 60. Station group 50, transport vehicle 60, and communication device 70 will be described in detail in the following sections.

1-2. Configuration Example of Article Transport System 100

Figure 3:
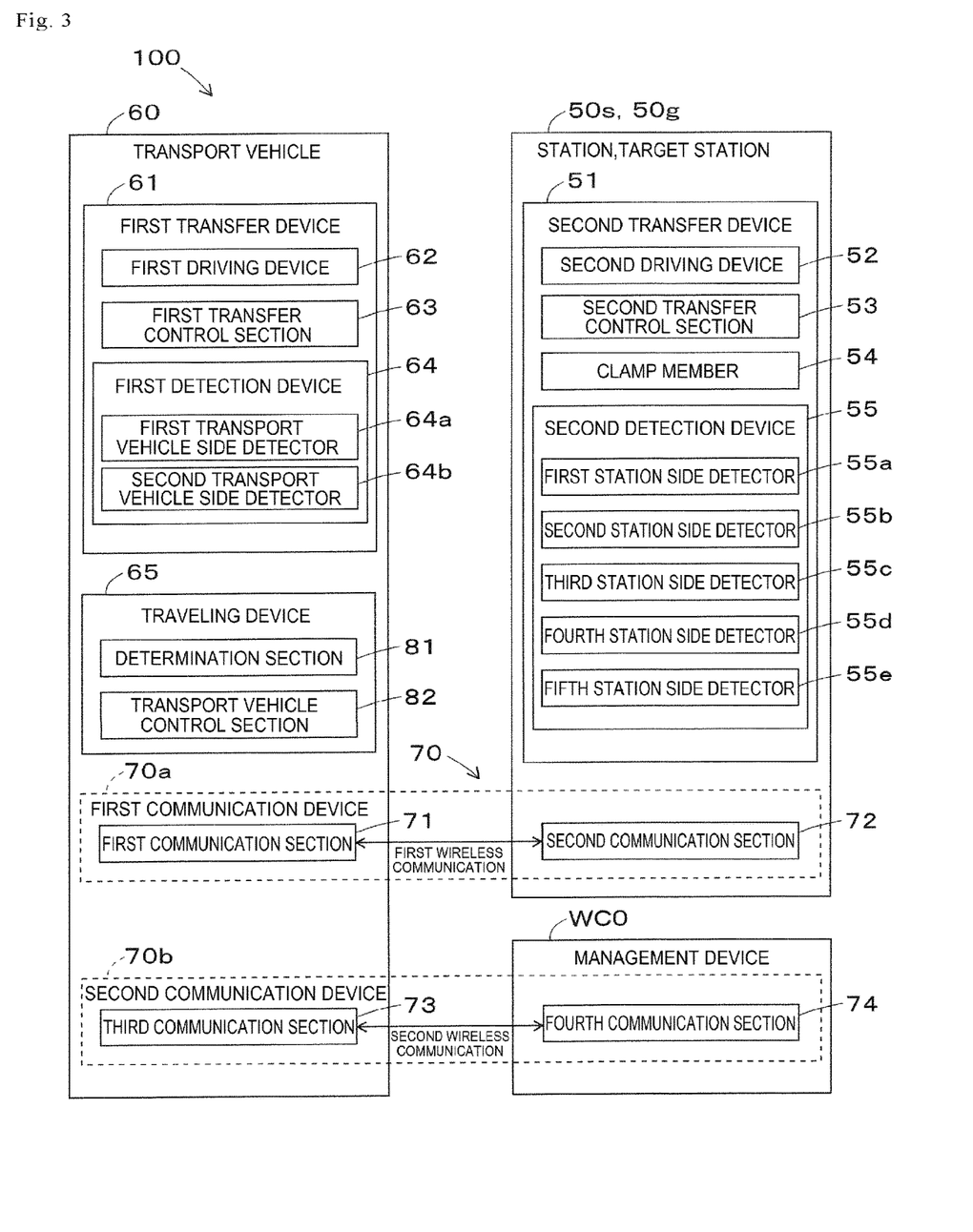
FIG. 3 is a block diagram showing an example of a control block of an article transport system.

Article transport system 100 includes station group 50, first communication device 70a, and determination section 81. Further, article transport system 100 may include management device WC0 and second communication device 70b. Further, article transport system 100 may include transport vehicle control section 82. Further, article transport system 100 may include transport vehicle 60. Transport vehicle 60 can send out and receive article AR0 or accommodation case 90 accommodating article AR0 (hereinafter, also simply referred to as article AR0 or accommodation case 90) between transport vehicle 60 and station group 50. As illustrated in FIGS. 1 and 3, article transport system 100 according to the present embodiment includes all of the above-described devices and control sections.

1-2-1. Transportation of Article AR0 or Accommodation Case 90

Station group 50 is provided with multiple stations 50s and 50s (two in FIG. 1 and FIG. 2) side by side capable of sending out and receiving article AR0 used in board work machine WM0 that performs a predetermined board work on the board. Each of multiple (two) stations 50s and 50s can also sending out and receiving accommodation case 90 accommodating article AR0. Further, as illustrated in FIG. 3, each of multiple (two) stations 50s and 50s includes second transfer device 51. Second transfer device 51 sends out article AR0 or accommodation case 90 to transport vehicle 60. Further, second transfer device 51 receives article AR0 or accommodation case 90 from transport vehicle 60.

It should be noted that station group 50 may be provided with multiple stations 50s side by side capable of sending out and receiving article AR0 or accommodation case 90, and the number of the stations 50s is not limited to two. Further, board work machine WM0 is not limited to component mounter 10. Board production line 1 may include various board work machines WM0. For example, board production line 1 may include board work machine WM0 such as a solder printer, a solder inspection machine, a reflow furnace, and an appearance inspection machine.

Similarly, article AR0 is not limited to feeder 20. The reel on which a component tape for accommodating the component to be mounted on the board is wound is included in article AR0. Further, a component tray in which the components to be mounted on the board are arranged is included in article AR0. Further, the component container in which the components to be mounted on the board are irregularly accommodated is included in article AR0. Further, a carriage capable of collectively exchanging multiple feeders 20 is included in article AR0.

Further, a holding member (for example, a suction nozzle, a chuck, or the like) for collecting and holding the component is included in article AR0. Further, a mounting head on which the component is mounted on the board using a holding member is included in article AR0. Further, the holding member accommodation device capable of accommodating the holding member is included in article AR0. The solder container accommodating the solder is included in article AR0. Further, in the case of a printing machine in which the solder is moved along the mask by a squeegee to print the solder on the board, the squeegee and the mask are included in article AR0. Further, in the case of a printing machine in which solder is applied by the printing head to each of multiple printing positions of the board, the printing head and the dispensing head are included in article AR0.

Transport vehicle 60 sends out and receives article AR0 or accommodation case 90 between transport vehicle 60 and predetermined station 50s among multiple (two) stations 50s and 50s. Specifically, as illustrated in FIGS. 2 and 3, transport vehicle 60 includes first transfer device 61 and traveling device 65. First transfer device 61 sends out article AR0 or accommodation case 90 to target station 50g. Further, first transfer device 61 receives article AR0 or accommodation case 90 from target station 50g. Target station 50g means station 50s where transport vehicle 60 is to send out or receive article AR0 or accommodation case 90.

Traveling device 65 causes transport vehicle 60 to travel. Transport vehicle 60 is moved to target station 50g by traveling device 65 and sends out article AR0 or accommodation case 90 to target station 50g by first transfer device 61. Transport vehicle 60 can also receive article AR0 or accommodation case 90 from target station 50g by first transfer device 61. Transport vehicle 60 of the present embodiment is an automatic guided vehicle and is capable of being self-traveled. Further, as illustrated in FIG. 1, guide member M0 indicating a traveling path of transport vehicle 60 and indicator member S0 serving as an indicator when transport vehicle 60 travels are formed on board production line 1. Guide member M0 and indicator member S0 improve the traveling accuracy of transport vehicle 60.

Guide member M0 and indicator member S0 may take various forms. In the present embodiment, guide member M0 and indicator member S0 are formed with a magnet tape. Traveling device 65 of transport vehicle 60 can prevent transport vehicle 60 from departing from the traveling path to be traveled by making transport vehicle 60 travel while sensing guide member M0. Further, traveling device 65 of transport vehicle 60 can confirm the traveling position of transport vehicle 60 by sensing indicator member S0.

For example, indicator member S0 includes reference member S1 indicating a reference position, first via member S21 indicating a first via position, second via member S22 indicating a second via position, first target member S31 indicating a first target position, and second target member S32 indicating a second target position. For example, traveling device 65 of transport vehicle 60 confirms that transport vehicle 60 travels at the reference position by sensing reference member S1.

Traveling device 65 causes transport vehicle 60 to travel toward target station 50g by a traveling path programmed in advance or a traveling path instructed by management device WC0. At this time, traveling device 65 causes transport vehicle 60 to travel while obtaining positional information about transport vehicle 60, detection information about obstacles in the vicinity of transport vehicle 60, and the like. Specifically, traveling device 65 generates a three-dimensional shape of a scene in the vicinity of transport vehicle 60 using, for example, an image sensor, compares the generated three-dimensional shape of the scene with a three-dimensional map created in advance, and obtains the positional information about transport vehicle 60. Further, traveling device 65 obtains the detection information about the obstacles in the vicinity of transport vehicle 60, for example, based on an acquisition image acquired by an image sensor or the like.

For example, it is assumed that station 50s on the left side of the drawing illustrated in FIG. 1 (hereinafter, referred to as a first station) is target station 50g, and transport vehicle 60 is moved from the reference position to the first target position. In this case, when traveling device 65 senses first via member S21, traveling device 65 rotates transport vehicle 60 rightward by 90° and then causes transport vehicle 60 to move straight. When traveling device 65 senses first target member S31, traveling device 65 causes transport vehicle 60 to stop.

Station 50s on the right side of the drawing illustrated in FIG. 1 (hereinafter referred to as a second station) is target station 50g, and the same applies when transport vehicle 60 is moved from the reference position to the second target position. In this case, when traveling device 65 senses second via member S22, traveling device 65 rotates transport vehicle 60 rightward by 90° and then causes transport vehicle 60 to move straight. When traveling device 65 senses second target member S32, traveling device 65 causes transport vehicle 60 to stop. It should be noted that traveling device 65 senses station group 50 (obstacles in the vicinity of transport vehicle 60) when a distance between transport vehicle 60 and station group 50 becomes equal to or shorter than a predetermined distance and can cause transport vehicle 60 to stop even when first target member S31 or second target member S32 is not sensed.

When transport vehicle 60 arrives at target station 50g, first transfer device 61 of transport vehicle 60 sends out article AR0 or accommodation case 90 to target station 50g, and second transfer device 51 of target station 50g receives article AR0 or accommodation case 90 from transport vehicle 60. Further, second transfer device 51 of target station 50g may send out article AR0 or accommodation case 90 to transport vehicle 60, and first transfer device 61 of transport vehicle 60 may receive article AR0 or accommodation case 90 from target station 50g.

Further, transport vehicle 60 may send out article AR0 or accommodation case 90 to first target station 50g, be moved to second target station 50g, and receive article AR0 or accommodation case 90 from second target station 50g. Further, transport vehicle 60 may receive article AR0 or accommodation case 90 from first target station 50g, be moved to second target station 50g, and send out article AR0 or accommodation case 90, which is received from first target station 50g, to second target station 50g.

For example, when the second station is target station 50g, traveling device 65 may erroneously sense first via member S21 as second via member S22 without sensing second via member S22. In this case, transport vehicle 60 may arrive at the first station that is different from the second station, which is target station 50g. Therefore, it is assumed that whether transport vehicle 60 has arrived at target station 50g is determined by the wireless communication. However, the shorter the separation distance between multiple (two) stations 50s and 50s adjacent to each other, the higher the possibility that transport vehicle 60 performs the wireless communication with station 50s adjacent to station 50s where transport vehicle 60 has arrived. Accordingly, article transport system 100 includes first communication device 70a and determination section 81.

Figure 4:
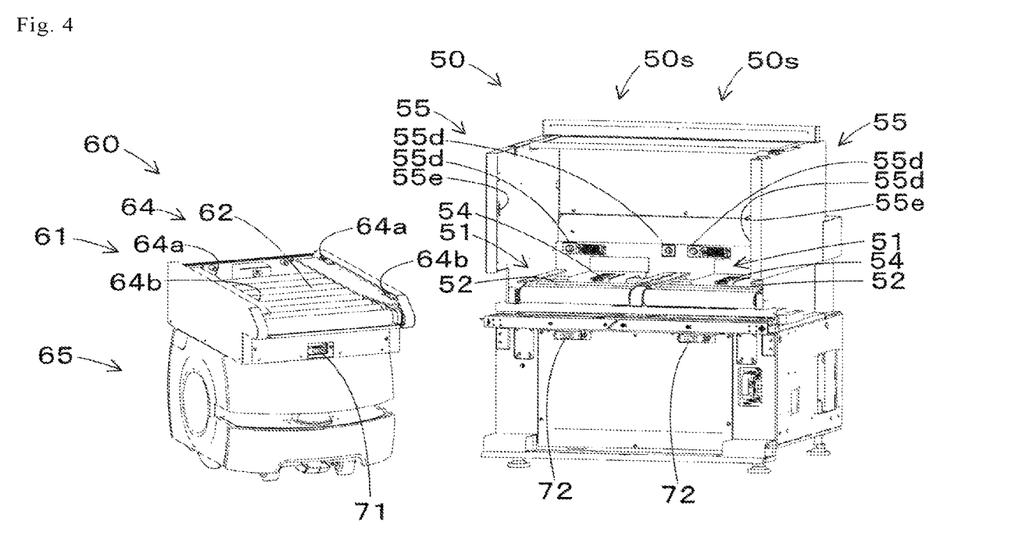
FIG. 4 is an oblique view of the station group and the transport vehicle showing a configuration example of a first communication device.
Figure 5:
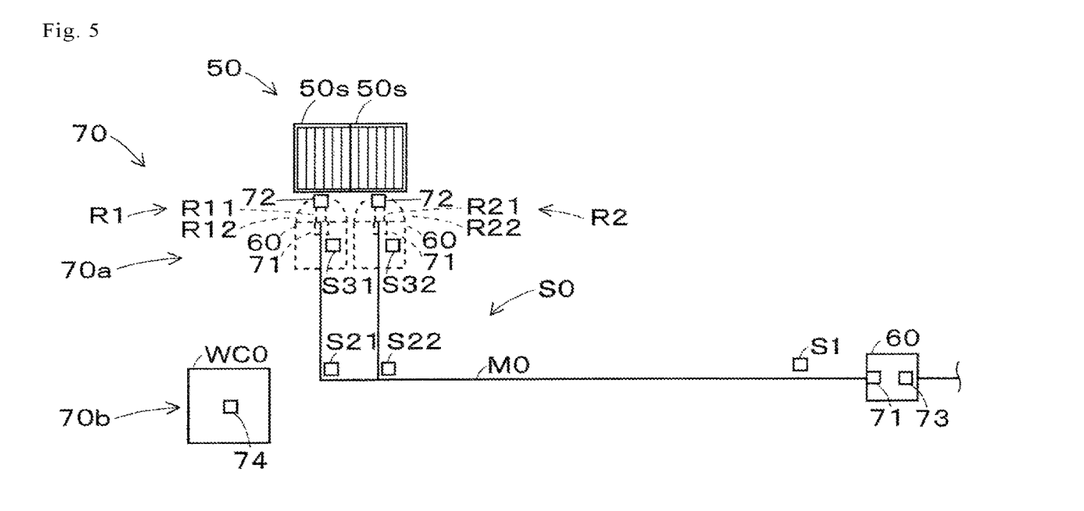
FIG. 5 is a schematic view showing an example of a communicable range of a first wireless communication.

First communication device 70a includes first communication section 71 provided in transport vehicle 60 and second communication section 72 provided in each of multiple (two) stations 50s and 50s. Specifically, as illustrated in FIGS. 4 and 5, transport vehicle 60 is provided with first communication section 71 at a portion facing one station 50s among multiple (two) stations 50s and 50s. Further, each of multiple (two) stations 50s and 50s is provided with second communication section 72 at a portion facing transport vehicle 60 when transport vehicle 60 has arrived.

Further, when transport vehicle 60 has arrived at one station 50s among multiple (two) stations 50s and 50s, the first wireless communication between second communication section 72, which is provided in the one station 50s, and first communication section 71 is permitted, and the first wireless communication between second communication section 72, which is provided in another station 50s, and first communication section 71 is regulated.

A transport vehicle 60 on the left side of the drawing represented with dashed lines in FIG. 5 indicates transport vehicle 60 that has arrived at the first station. Communicable range R1 indicates a communicable range of the wireless communication between second communication section 72 provided in the first station and first communication section 71 provided in transport vehicle 60. Band shaped portion R11 represented with dashed lines indicates communicable range R1 when the first wireless communication has directivity, and arc portion R12 represented with dashed lines indicates communicable range R1 when the first wireless communication has no directivity.

Transport vehicle 60 on the right side of the drawing represented with dashed lines in FIG. 5 indicates transport vehicle 60 that has arrived at the second station adjacent to the first station. Communicable range R2 indicates a communicable range of the wireless communication between second communication section 72 provided in the second station and first communication section 71 provided in transport vehicle 60. Band shaped portion R21 represented with dashed lines indicates communicable range R2 when the first wireless communication has directivity, and arc portion R22 represented with dashed lines indicates communicable range R2 when the first wireless communication has no directivity.

As described above, the communicable range of the first wireless communication is set such that communicable range R1 and communicable range R2 of stations 50s adjacent to each other do not overlap with each other. Therefore, in the first wireless communication, communicable range R1 of the wireless communication between second communication section 72, which is provided in the one station 50s, and first communication section 71, and communicable range R2 of the wireless communication between second communication section 72, which is provided in station 50s adjacent to the one station 50s, and first communication section 71 do not overlap with each other. Therefore, transport vehicle 60 can perform the first wireless communication with the one station 50s where transport vehicle 60 has arrived, and the first wireless communication between transport vehicle 60 and another station 50s is easily regulated.

Further, the first wireless communication of the present embodiment is optical communication. The optical communication is wireless communication having directivity, improves the transmission efficiency as compared with wireless communication having no directivity, and is less susceptible to noise during reception, thereby improves reception sensitivity. Further, the optical communication can initiate the first wireless communication with station 50s before transport vehicle 60 arrives at the one station 50s. The first wireless communication may be, for example, the wireless communication having no directivity such as infrared communication or wireless communication used for a radio frequency identifier (RFID).

Determination section 81 determines whether transport vehicle 60 has arrived at target station 50g by utilizing first communication device 70a. Determination section 81 can be provided, for example, in transport vehicle 60 or station group 50. Further, determination section 81 may be provided in line control device LC0 or management device WC0. Further, determination section 81 may be formed on a cloud. In the present embodiment, determination section 81 is provided in traveling device 65 of transport vehicle 60.

For example, when preparation for sending out or receiving article AR0 or accommodation case 90 with transport vehicle 60 is completed on target station 50g, second communication section 72 transmits a preparation completion signal to transport vehicle 60. In contrast to this, in stations 50s other than target station 50g, since sending out and receiving of article AR0 or accommodation case 90 is not performed with transport vehicle 60, second communication section 72 of stations 50s other than target station 50g does not transmit the preparation completion signal to transport vehicle 60. Therefore, determination section 81 can determine whether transport vehicle 60 has arrived at target station 50g based on a presence or absence of reception of a predetermined control signal such as the preparation completion signal.

Determination section 81 can detect that transport vehicle 60 has arrived at one station 50s by utilizing first communication device 70a and determine whether the one station 50s where arrival is detected is target station 50g. Specifically, determination section 81 detects that transport vehicle 60 has arrived at one station 50s when the predetermined control signal can be received between second communication section 72 provided in one station 50s and first communication section 71 of transport vehicle 60 by the first wireless communication. Thereafter, determination section 81 determines that one station 50s where the arrival is detected is target station 50g.

When multiple transport vehicles 60 simultaneously send out and receive articles AR0 or accommodation cases 90 in station group 50, there is a possibility that multiple second communication sections 72 of multiple stations 50s transmit predetermined control signals such as the preparation completion signals to transport vehicles 60. In this case, target station 50g is set for each transport vehicle 60, and determination section 81 needs to identify target station 50g to determine whether one station 50s where the arrival is detected is target station 50g.

Determination section 81 can acquire the identification information of one station 50s by utilizing first communication device 70a and determine whether one station 50s is target station 50g based on whether the acquired identification information of one station 50s matches the identification information of target station 50g. Specifically, determination section 81 determines that one station 50s is target station 50g when the acquired identification information of one station 50s matches the identification information of target station 50g. Conversely, when the acquired identification information of one station 50s does not match the identification information of target station 50g, determination section 81 determines that one station 50s is not target station 50g.

Even when one transport vehicle 60 sends out and receives article AR0 or accommodation case 90 in station group 50, determination section 81 can determine whether one station 50s is target station 50g based on the identification information of station 50s. Further, in target station 50g, the identification information of station 50s can be transmitted to transport vehicle 60 through the predetermined control signal such as the preparation completion signal. In this case, determination section 81 can also determine whether one station 50s is target station 50g based on the presence or absence of the reception of the predetermined control signal and the identification information of station 50s.

When determination section 81 determines that transport vehicle 60 has not arrived at target station 50g, transport vehicle control section 82 causes transport vehicle 60 to retry the movement to target station 50g. Transport vehicle control section 82 can be provided, for example, in transport vehicle 60. Further, transport vehicle control section 82 may be provided in management device WC0. Further, transport vehicle control section 82 may be formed on a cloud. In the present embodiment, transport vehicle control section 82 is provided in traveling device 65 of transport vehicle 60.

For example, it is assumed that transport vehicle 60 has arrived at the second station when the first station is target station 50g. In this case, determination section 81 determines that transport vehicle 60 has not arrived at target station 50g. Accordingly, transport vehicle control section 82 causes traveling device 65 to retry the movement of transport vehicle 60 to target station 50g. Specifically, transport vehicle control section 82 causes traveling device 65 to make transport vehicle 60 travel to, for example, a reference position where reference member S1 illustrated in FIG. 1 is provided. Thereafter, transport vehicle control section 82 causes traveling device 65 to make transport vehicle 60 travel from the reference position to the first station. Further, transport vehicle control section 82 can also cause traveling device 65 to make transport vehicle 60 travel directly from the second station to the first station.

It should be noted that transport vehicle control section 82 may change a traveling state of transport vehicle 60 (for example, a traveling speed or the like) in accordance with the number of retries. For example, as the number of retries increases, transport vehicle control section 82 can reduce the traveling speed of transport vehicle 60. Further, when there are multiple traveling paths of transport vehicle 60, transport vehicle control section 82 can change the traveling path of transport vehicle 60 at the time of retry. Further, when the number of retries reaches a predetermined number of times, transport vehicle control section 82 can also cancel the retries and move transport vehicle 60 to a predetermined position (for example, a standby position of transport vehicle 60 or the like).

Figure 6:
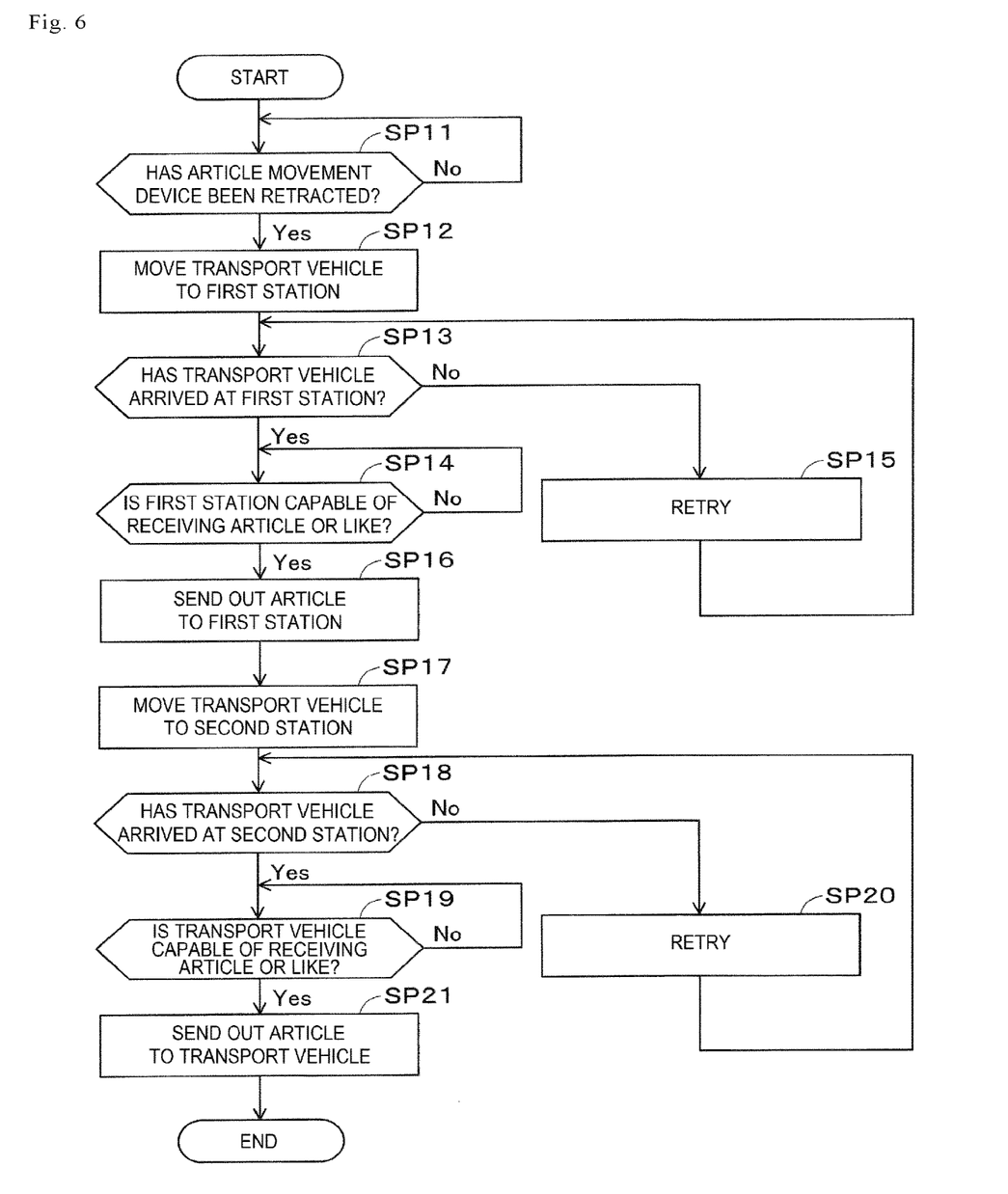
FIG. 6 is a flowchart showing an example of a transporting procedure of an article or the like by the article transport system.

Article transport system 100 of the present embodiment transports article AR0 or accommodation case 90, for example, in accordance with the flowchart illustrated in FIG. 6. In a transporting procedure illustrated in the drawing, first, transport vehicle 60 is moved to the first station, which is first target station 50g, and sends out article AR0 or accommodation case 90 to the first station. Thereafter, transport vehicle 60 is moved to a second station, which is second target station 50g, and receives article AR0 or accommodation case 90 from the second station.

Specifically, first, transport vehicle control section 82 determines whether article movement device 40 has been retracted to a retraction position (step SP11). The retraction position is set to a position at which article movement device 40 and transport vehicle 60 illustrated in FIG. 1 do not interfere with each other. When article movement device 40 has been retracted to the retraction position (Yes in step SP11), transport vehicle control section 82 moves transport vehicle 60 to the first station (step SP12). When article movement device 40 has not been retracted to the retraction position (No in step SP11), transport vehicle control section 82 waits until article movement device 40 is retracted to the retraction position.

Next, determination section 81 determines whether transport vehicle 60 has arrived at the first station, as described above (step SP13). When transport vehicle 60 has arrived at the first station (Yes in step SP13), first transfer control section 63 described later confirms whether the first station is capable of receiving article AR0 or accommodation case 90 (step SP14). When transport vehicle 60 has not arrived at the first station (No in step SP13), transport vehicle control section 82 causes transport vehicle 60 to retry the movement to the first station as described above (step SP15) Thereafter, the control returns to step SP13.

When the first station is capable of receiving article AR0 or accommodation case 90 (Yes in step SP14), first transfer device 61 sends out article AR0 or accommodation case 90 to the first station as described above (step SP16). When the first station is not capable of receiving article AR0 or accommodation case 90 (No in step SP14), first transfer device 61 waits until the first station is capable of receiving article AR0 or accommodation case 90.

When first transfer device 61 confirms that article AR0 or accommodation case 90 is sent out, and second transfer device 51 confirms that article AR0 or accommodation case 90 is received, transport vehicle control section 82 moves transport vehicle 60 to the second station (step SP17). Further, determination section 81 similarly determines whether transport vehicle 60 has arrived at the second station (step SP18). When transport vehicle 60 has arrived at the second station (Yes in step SP18), second transfer control section 53 described later confirms whether transport vehicle 60 is capable of receiving article AR0 or accommodation case 90 (step SP19). When transport vehicle 60 has not arrived at the second station (No in step SP18), transport vehicle control section 82 causes transport vehicle 60 to retry the movement to the second station as described above (step SP20). Thereafter, the control returns to step SP18.

When transport vehicle 60 is capable of receiving article AR0 or accommodation case 90 (Yes in step SP19), second transfer device 51 sends out article AR0 or accommodation case 90 to transport vehicle 60 as described above (step SP21). When transport vehicle 60 is not capable of receiving article AR0 or accommodation case 90 (No in step SP19), second transfer device 51 waits until transport vehicle 60 is capable of receiving article AR0 or accommodation case 90. When second transfer device 51 confirms that article AR0 or accommodation case 90 is sent out, and first transfer device 61 confirms that article AR0 or accommodation case 90 is received, transport vehicle control section 82 moves transport vehicle 60 to the predetermined position, and the control is temporarily terminated.

A state in which determination section 81 determines that transport vehicle 60 has arrived at target station 50g set by the operator, and articles AR0 or accommodation cases 90 accommodating articles AR0 are mounted on both transport vehicle 60 and target station 50g, is defined as a first state. Further, a state in which determination section 81 determines that transport vehicle 60 has arrived at target station 50g set by the operator, and articles AR0 or accommodation cases 90 accommodating articles AR0 are not mounted on both transport vehicle 60 and target station 50g, is defined as a second state.

The first state or the second state is a state in which transport vehicle 60 has arrived at target station 50g but article AR0 or accommodation case 90 cannot be sent out and received between transport vehicle 60 and target station 50g. This is because, for example, in a mode in which target station 50g is set by the operator, the operator erroneously sets target station 50g.

When the first state or the second state is confirmed by the first wireless communication, transport vehicle control section 82 can determine that target station 50g is erroneously set and move transport vehicle 60 to the predetermined position. Although the predetermined position is not limited, transport vehicle control section 82 can move transport vehicle 60 to, for example, a standby position of transport vehicle 60. As described later, whether article AR0 or accommodation case 90 is mounted on transport vehicle 60 can be detected by first transfer device 61. Whether article AR0 or accommodation case 90 is mounted on target station 50g can be detected by second transfer device 51.

Target station 50g can also be set by management device WC0. Management device WC0 manages transport vehicle 60 when transport vehicle 60 is an automatic guided vehicle. For example, management device WC0 can manage the traveling of transport vehicle 60. Specifically, management device WC0 can set target station 50g, set the traveling path of transport vehicle 60, give a traveling instruction to transport vehicle 60, and the like.

In order for management device WC0 to perform the wireless communication with transport vehicle 60, a wider range of wireless communication is required as compared with the first wireless communication. Accordingly, article transport system 100 includes second communication device 70b. Second communication device 70b performs communication between management device WC0 and transport vehicle 60 using the second wireless communication capable of performing the wider range of wireless communication as compared with the first wireless communication.

As illustrated in FIG. 1, second communication device 70b includes third communication section 73 provided in transport vehicle 60 and fourth communication section 74 provided in management device WC0. It is sufficient when the second wireless communication is possible between third communication section 73 and fourth communication section 74, and the installation portions of third communication section 73 and fourth communication section 74 are not limited. Further, the communicable range of the second wireless communication between third communication section 73 and fourth communication section 74 is set so as to include a travelable range in which transport vehicle 60 may travel. For example, the second wireless communication can use wireless communication having no directivity such as a wireless LAN.

1-2-2. Configuration Example of Transport Vehicle 60 and Target Station 50g

As illustrated in FIGS. 2 to 4, transport vehicle 60 includes first transfer device 61 and traveling device 65. First transfer device 61 includes first driving device 62, first transfer control section 63, and first detection device 64. First detection device 64 includes first transport vehicle side detector 64a and second transport vehicle side detector 64b. As described above, traveling device 65 includes determination section 81 and transport vehicle control section 82.

First transfer device 61 sends out article AR0 or accommodation case 90 accommodating article AR0 to target station 50g and receives article AR0 or accommodation case 90 from target station 50g. Specifically, first transfer device 61 performs sending out and receiving of article AR0 or accommodation case 90 accommodating article AR0 by first driving device 62 and first transfer control section 63.

As first driving device 62, for example, a known transfer device such as a roller conveyor, a belt conveyor, a robot arm, or a crane can be used. As illustrated in FIGS. 2 and 4, first driving device 62 of the present embodiment is configured with a roller conveyor. First transfer control section 63 is provided in a control device of first transfer device 61. First transfer control section 63 causes first driving device 62 to send out article AR0 or accommodation case 90 to target station 50g and to receive article AR0 or accommodation case 90 from target station 50g.

Further, first transfer device 61 sends out article AR0 or accommodation case 90 to target station 50g when determination section 81 determines that transport vehicle 60 has arrived at target station 50g and first transfer device 61 confirms that target station 50g is capable of receiving article AR0 or accommodation case 90 by the first wireless communication. Specifically, first transfer control section 63 acquires, from determination section 81, a determination result as to whether transport vehicle 60 has arrived at target station 50g. Further, first transfer control section 63 confirms whether the preparation completion signal, in which preparation of sending out and receiving of article AR0 or accommodation case 90 is completed, is received from target station 50g.

First transfer control section 63 causes first driving device 62 to send out article AR0 or accommodation case 90 to target station 50g when determination section 81 determines that transport vehicle 60 has arrived at target station 50g and first transfer control section 63 confirms that the preparation completion signal is received from target station 50g. As a result, first driving device 62 sends out article AR0 or accommodation case 90 to target station 50g.

Further, first transfer device 61 includes first detection device 64. First detection device 64 includes first transport vehicle side detector 64a and second transport vehicle side detector 64b. First transport vehicle side detector 64a detects the presence or absence of article AR0 or accommodation case 90. Second transport vehicle side detector 64b detects whether articles AR0, which is not accommodated in accommodation case 90, is moved beyond a predetermined mounting range. Further, second transport vehicle side detector 64b can also detect whether at least one of article AR0, which is accommodated in accommodation case 90, and accommodation case 90 is moved beyond the predetermined mounting range.

As illustrated in FIGS. 2 and 4, in the present embodiment, first transport vehicle side detector 64a is provided on the proximal end side of the mounting range of article AR0 or accommodation case 90. Second transport vehicle side detector 64b is provided on the distal end side of the mounting range of article AR0 or accommodation case 90. As first transport vehicle side detector 64a and second transport vehicle side detector 64b, known detectors can be used. In the present embodiment, a light shielding sensor is used for first transport vehicle side detector 64a and second transport vehicle side detector 64b.

First transport vehicle side detector 64a is shielded from light when article AR0 or accommodation case 90 is mounted on first transfer device 61 and detects that article AR0 or accommodation case 90 is mounted on first transfer device 61. Second transport vehicle side detector 64b is shielded from light when article AR0, which is not accommodated in accommodation case 90, is moved beyond the predetermined mounting range and detects that article AR0 is moved beyond the predetermined mounting range. Further, second transport vehicle side detector 64b can also be shielded from light when at least one of article AR0, which is accommodated in accommodation case 90, and accommodation case 90 is moved beyond the predetermined mounting range, and detect that at least one of article AR0, which is accommodated in accommodation case 90, and accommodation case 90 is moved beyond the predetermined mounting range.

As illustrated in FIGS. 3, 4, 7, and 8, target station 50g includes second transfer device 51. Second transfer device 51 includes second driving device 52, second transfer control section 53, clamp member 54, and second detection device 55. Second detection device 55 includes first station side detector 55a, second station side detector 55b, third station side detector 55c, fourth station side detector 55d, and fifth station side detector 55e.

Second transfer device 51 sends out article AR0 or accommodation case 90 accommodating article AR0 to transport vehicle 60 and receives article AR0 or accommodation case 90 from transport vehicle 60. Specifically, second transfer device 51 sends out and receives article AR0 or accommodation case 90 accommodating article AR0 by second driving device 52 and second transfer control section 53.

Figure 7:
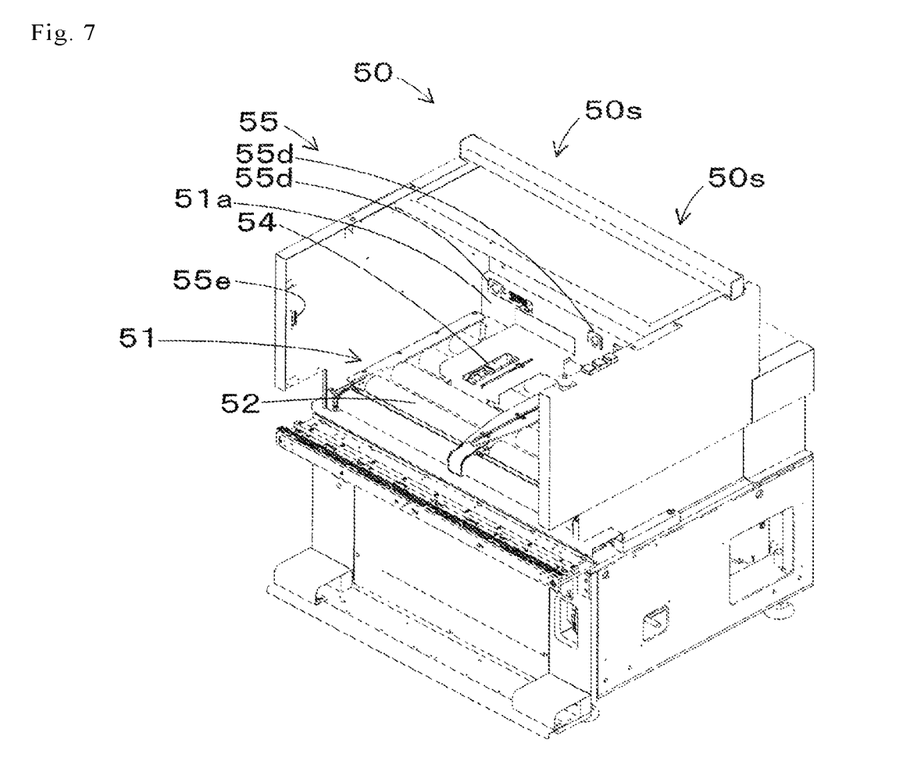
FIG. 7 is an enlarged view of the station group which is not equipped with an accommodation case.

As second driving device 52, for example, a known transfer device such as a roller conveyor, a belt conveyor, a robot arm, or a crane can be used. As illustrated in FIGS. 4 and 7, second driving device 52 of the present embodiment is configured with a roller conveyor. Second transfer control section 53 is provided in the control device of second transfer device 51. Second transfer control section 53 causes second driving device 52 to send out article AR0 or accommodation case 90 to transport vehicle 60 and to receive article AR0 or accommodation case 90 from transport vehicle 60.

Further, second transfer device 51 sends out article AR0 or accommodation case 90 to transport vehicle 60 when determination section 81 determines that transport vehicle 60 has arrived at target station 50g and second transfer device 51 confirms that transport vehicle 60 is capable of receiving article AR0 or accommodation case 90 by the first wireless communication. Specifically, second transfer control section 53 acquires, from determination section 81, a determination result as to whether transport vehicle 60 has arrived at target station 50g. Further, second transfer control section 53 confirms whether the preparation completion signal, in which preparation of sending out and receiving of article AR0 or accommodation case 90 is completed, is received from transport vehicle 60.

Second transfer control section 53 causes second driving device 52 to send out article AR0 or accommodation case 90 to transport vehicle 60 when determination section 81 determines that transport vehicle 60 has arrived at target station 50g and second transfer control section 53 confirms that the preparation completion signal is received from transport vehicle 60. As a result, second driving device 52 sends out article AR0 or accommodation case 90 to transport vehicle 60.

Figure 9:
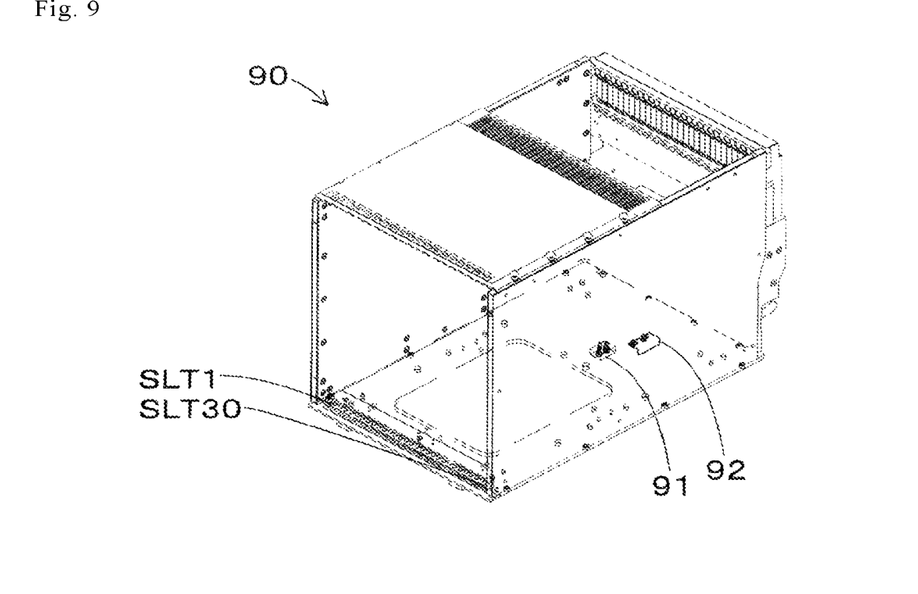
FIG. 9 is a perspective view showing a configuration example of an accommodation case.

As illustrated in FIG. 9, accommodation case 90 includes clamp target member 91 to be clamped with second transfer device 51. Clamp target member 91 is provided on a bottom face that contacts second driving device 52 when accommodation case 90 is mounted on second driving device 52. Clamp target member 91 is formed in a rectangular parallelepiped shape, for example, and protrudes from a bottom face of accommodation case 90. In order to illustrate clamp target member 91 and detection target member 92 to be described later, FIG. 9 illustrates, for convenience of illustration, the side face and the bottom face of accommodation case 90 in a transparent manner.

Figure 8:
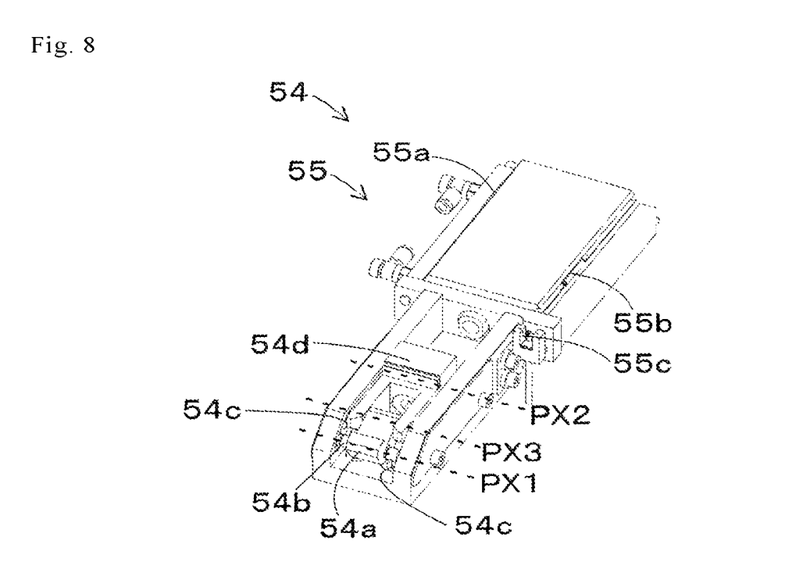
FIG. 8 is an oblique view showing a clamp member in an unclamped state.
Figure 10:
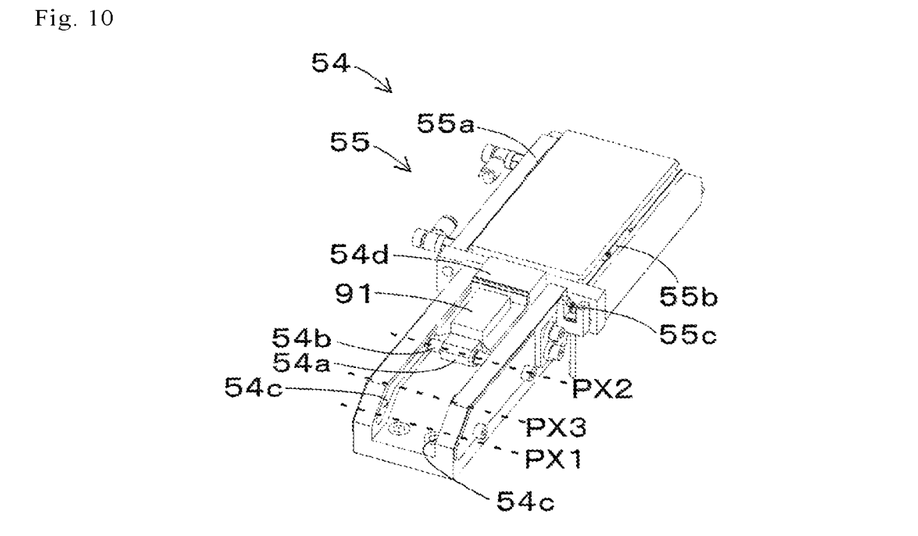
FIG. 10 is an oblique view showing the clamp member in a clamped state.

As illustrated in FIGS. 7, 8, and 10, second transfer device 51 includes clamp member 54 that clamps clamp target member 91 of accommodation case 90. FIG. 8 illustrates an unclamped state in which clamp member 54 does not clamp clamp target member 91. FIG. 10 illustrates a clamped state in which clamp member 54 clamps clamp target member 91.

Clamp member 54 includes claw portion 54a, shaft portion 54b, guide portion 54c, and movement device 54d. Shaft portion 54b passes through claw portion 54a, and claw portion 54a is configured to be rotatable about shaft portion 54b with a shaft center. Guide portion 54c is formed in a pair of grooves from position PX1 on the distal end side of the mounting range of accommodation case 90 to position PX2 on the proximal end side thereof, and claw portion 54a and shaft portion 54b can be moved between position PX1 and position PX2 in a state in which both end portions of shaft portion 54b are fitted with guide portion 54c. Further, when shaft portion 54b is moved from position PX1 to position PX3, guide portion 54c inclines such that claw portion 54a gradually approaches clamp target member 91, and a section from position PX3 to position PX2 extends in the horizontal direction.

When clamping clamp target member 91, movement device 54d can hold clamp target member 91 with claw portion 54a and move from the distal end side to the proximal end side of the mounting range of accommodation case 90. Further, when unclamping clamp target member 91, movement device 54d also can hold clamp target member 91 with claw portion 54a and move from the proximal end side to the distal end side of the mounting range of accommodation case 90. As movement device 54d, for example, a known cylinder can be used.

When accommodation case 90 is sent out from transport vehicle 60, clamp target member 91 of accommodation case 90 contacts movement device 54d in a state illustrated in FIG. 8. According to the above-described shape of guide portion 54c, claw portion 54a contacts clamp target member 91 so as to pull in clamp target member 91 while rotating about shaft portion 54b with the shaft center. At this time, movement device 54d holds clamp target member 91 with claw portion 54a, is moved from the distal end side to the proximal end side of the mounting range of accommodation case 90, and enters the clamped state illustrated in FIG. 10.

Conversely, when accommodation case 90 is sent out from second transfer device 51, movement device 54d illustrated in FIG. 10 is moved from the proximal end side to the distal end side of the mounting range of accommodation case 90. When shaft portion 54b is moved from position PX2 to position PX3, movement device 54d holds clamp target member 91 with claw portion 54a. When shaft portion 54b is moved from position PX3 to position PX1, claw portion 54a is rotated about shaft portion 54b with the shaft center so as to push clamp target member 91 with the above-described shape of guide portion 54c so that claw portion 54a enters the unclamped state illustrated in FIG. 8.

Second transfer device 51 includes second detection device 55. Second detection device 55 includes first station side detector 55a, second station side detector 55b, third station side detector 55c, fourth station side detector 55d, and fifth station side detector 55e.

First station side detector 55a detects the clamped state in which clamp member 54 clamps clamp target member 91. Second station side detector 55b detects the unclamped state in which clamp member 54 does not clamp clamp target member 91. As illustrated in FIG. 10, movement device 54d is moved to the proximal end side of the mounting range of accommodation case 90 in the clamped state. Conversely, as illustrated in FIG. 8, movement device 54d is moved to the distal end side of the mounting range of accommodation case 90 in the unclamped state. Therefore, first station side detector 55a and second station side detector 55b can detect the clamped state and the unclamped state by detecting a position of movement device 54d (for example, a position of the cylinder).

As illustrated in FIG. 9, accommodation case 90 includes detection target member 92 that is used when detecting whether article AR0 or accommodation case 90 is positioned at a predetermined position of second transfer device 51. Detection target member 92 is provided on a bottom face that contacts second driving device 52 when accommodation case 90 is mounted on second driving device 52. Detection target member 92 is formed in, for example, an L-shape and protrudes from a bottom face of accommodation case 90.

Third station side detector 55c detects the clamped state or the unclamped state based on the presence or absence of detection of detection target member 92. As illustrated in FIGS. 8 and 10, third station side detector 55c is provided in the vicinity of clamp member 54, and a light shielding sensor is used. Third station side detector 55c can detect detection target member 92 by shielding detection target member 92 from light to detect the clamped state. In other words, third station side detector 55c can detect the unclamped state without detecting detection target member 92 by not shielding detection target member 92 from light.

It should be noted that clamp target member 91 and detection target member 92 may be provided on article AR0 that is not accommodated in accommodation case 90. For example, clamp target member 91 and detection target member 92 may be provided on a carriage or the like that is capable of collectively exchanging multiple feeders 20. The above description can be similarly applied to a case where clamp target member 91 and detection target member 92 are provided on article AR0 that is not accommodated in accommodation case 90.

As illustrated in FIG. 7, second transfer device 51 includes support member 51a that contacts article AR0 or accommodation case 90 in the clamped state. Fourth station side detector 55d detects a close contact state between article AR0 or accommodation case 90 and support member 51a. Fifth station side detector 55e detects whether article AR0, which is not accommodated in accommodation case 90, is moved beyond the predetermined mounting range. Further, fifth station side detector 55e can also detect whether at least one of article AR0, which is accommodated in accommodation case 90, and accommodation case 90 is moved beyond the predetermined mounting range.

As illustrated in FIGS. 4 and 7, in the present embodiment, fourth station side detector 55d is provided on the proximal end side of the mounting range of article AR0 or accommodation case 90. Fifth station side detector 55e is provided on the distal end side of the mounting range of article AR0 or accommodation case 90. As fourth station side detector 55d and fifth station side detector 55e, known detectors can be used. In the present embodiment, a proximity sensor is used as fourth station side detector 55d. As fifth station side detector 55e, a light shielding sensor is used.

When a distance between article AR0 or accommodation case 90 and support member 51a is equal to or shorter than a predetermined distance, fourth station side detector 55d detects article AR0 or accommodation case 90 and detects that article AR0 or accommodation case 90 and support member 51a are in the close contact state. Fifth station side detector 55e is shielded from light when article AR0, which is not accommodated in accommodation case 90, is moved beyond the predetermined mounting range, and detects that article AR0 is moved beyond the predetermined mounting range. Further, fifth station side detector 55e can also be shielded from light when at least one of article AR0, which is accommodated in accommodation case 90, and accommodation case 90 is moved beyond the predetermined mounting range, and detect that at least one of article AR0, which is accommodated in accommodation case 90, and accommodation case 90 is moved beyond the predetermined mounting range.

2. Others

In the present embodiment, station group 50 is provided in board production line 1, but station group 50 can be provided in various board production facilities. For example, station group 50 may be provided in a storage for storing article AR0 used in board work machine WM0.

3. Example of Effects of Embodiment

Article transport system 100 includes station group 50, first communication device 70a, and determination section 81. Accordingly, article transport system 100 can determine whether transport vehicle 60 has arrived at target station 50g, which is station 50s where transport vehicle 60 is to send out or receive article AR0, by utilizing first communication device 70a.

REFERENCE SIGNS LIST

50: station group
50s: station
50g: target station
51: second transfer device
51a: support member
54: clamp member
55a: first station side detector
55b: second station side detector
55c: third station side detector
55d: fourth station side detector
55e: fifth station side detector
60: transport vehicle
61: first transfer device
64a: first transport vehicle side detector
64b: second transport vehicle side detector
70a: first communication device
70b: second communication device
71: first communication section
72: second communication section
81: determination section
82: transport vehicle control section
90: accommodation case
91: clamp target member
92: detection target member
100: article transport system
AR0: article
R1, R2: communicable range
WC0: management device
WM0: board work machine

The invention claimed is:

1. An article transport system comprising:
a station group in which multiple stations capable of sending out and receiving an article, which is used in a board work machine performing a predetermined board work on a board, are arranged side by side;
a first communication device configured to include a first communication section, which is provided in a transport vehicle capable of sending out and receiving the article between the transport vehicle and a predetermined station among the multiple stations, and a second communication section, which is provided in each of the multiple stations, in which when the transport vehicle has arrived at one station among the multiple stations, first wireless communication between the second communication section, which is provided in the one station, and the first communication section is permitted, and the first wireless communication between the second communication section, which is provided in another station, and the first communication section is regulated; and
a determination section configured to determine whether the transport vehicle has arrived at a target station, which is the station where the transport vehicle is to send out or receive the article, by utilizing the first communication device.

2. The article transport system according to claim 1, wherein the determination section detects an arrival of the transport vehicle at the one station by utilizing the first communication device and determines whether the one station, where the arrival of the transport vehicle is detected, is the target station.

3. The article transport system according to claim 1, wherein the determination section acquires identification information of the one station by utilizing the first communication device and determines whether the one station is the target station based on whether the acquired identification information of the one station matches identification information of the target station.

4. The article transport system according to claim 1,
wherein in the first wireless communication, a communicable range of wireless communication between the second communication section, which is provided in the one station, and the first communication section and a communicable range of wireless communication between the second communication section, which is provided in the station adjacent to the one station, and the first communication section do not overlap with each other.

5. The article transport system according to claim 4,
wherein the first wireless communication is optical communication.

6. The article transport system according to claim 1, further comprising:
a management device that manages the transport vehicle, and
a second communication device that performs communication between the management device and the transport vehicle using second wireless communication capable of wider range of wireless communication than the first wireless communication,
wherein the transport vehicle is an automatic guided vehicle.

7. The article transport system according to claim 1,
wherein the transport vehicle includes a first transfer device that sends out the article or an accommodation case accommodating the article to the target station and receives the article or the accommodation case from the target station, and
the first transfer device sends out the article or the accommodation case to the target station when the determination section determines that the transport vehicle has arrived at the target station, and it is confirmed that the target station is capable of receiving the article or the accommodation case by the first wireless communication.

8. The article transport system according to claim 7,
wherein the first transfer device includes
a first transport vehicle side detector that detects a presence or absence of the article or the accommodation case, and
a second transport vehicle side detector that detects whether the article, which is not accommodated in the accommodation case, or at least one of the article which is accommodated in the accommodation case and the accommodation case is moved beyond a predetermined mounting range.

9. The article transport system according to claim 1,
wherein the target station is provided with a second transfer device that sends out the article or an accommodation case accommodating the article to the transport vehicle and receives the article or the accommodation case from the transport vehicle, and
the second transfer device sends out the article or the accommodation case to the transport vehicle when the determination section determines that the transport vehicle has arrived at the target station, and it is confirmed that the transport vehicle is capable of receiving the article or the accommodation case by the first wireless communication.

10. The article transport system according to claim 9,
wherein the article or the accommodation case includes a clamp target member clamped to the second transfer device, and
the second transfer device includes
a clamp member that clamps the clamp target member of the article or the accommodation case,
a first station side detector that detects a clamped state in which the clamp member clamps the clamp target member, and
a second station side detector that detects an unclamped state in which the clamp member does not clamp the clamp target member.

11. The article transport system according to claim 10,
wherein the article or the accommodation case includes a detection target member used when detecting whether the article or the accommodation case is positioned at a predetermined position in the second transfer device, and
the second transfer device includes a third station side detector that detects the clamped state or the unclamped state based on a presence or absence of detection of the detection target member.

12. The article transport system according to claim 10,
wherein the second transfer device includes
a support member that is in contact with the article or the accommodation case in the clamped state,
a fourth station side detector that detects a close contact state between the article or the accommodation case, and the support member, and
a fifth station side detector that detects whether the article, which is not accommodated in the accommodation case, or at least one of the article, which is accommodated in the accommodation case, and the accommodation case is moved beyond a predetermined mounting range.

13. The article transport system according to claim 1, further comprising:
a transport vehicle control section configured to cause the transport vehicle to retry movement to the target station when the determination section determines that the transport vehicle has not arrived at the target station.

14. The article transport system according to claim 1, further comprising:
when a state in which the determination section determines that the transport vehicle has arrived at the target station set by an operator and the articles or the accommodation cases accommodating the articles are mounted on both the transport vehicle and the target station is defined as a first state, and a state in which the determination section determines that the transport vehicle has arrived at the target station set by the operator and the articles or the accommodation cases accommodating the articles are not mounted on both the transport vehicle and the target station is defined as a second state,
a transport vehicle control section configured to determine that the target station is erroneously set and move the transport vehicle to a predetermined position when the first state or the second state is confirmed by the first wireless communication.

* * * * *